United States Patent
Lin et al.

(10) Patent No.: US 10,671,788 B2
(45) Date of Patent: Jun. 2, 2020

(54) METHOD, SYSTEM, AND STORAGE MEDIUM OF RESOURCE PLANNING FOR DESIGNING SEMICONDUCTOR DEVICE

(71) Applicant: TAIWAN SEMICONDUCTOR MANUFACTURING COMPANY LTD., Hsinchu (TW)

(72) Inventors: Yen-Hung Lin, Hsinchu (TW); Chung-Hsing Wang, Hsinchu County (TW); Yuan-Te Hou, Hsinchu (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 84 days.

(21) Appl. No.: 15/961,181

(22) Filed: Apr. 24, 2018

(65) Prior Publication Data
US 2019/0155980 A1    May 23, 2019

Related U.S. Application Data

(60) Provisional application No. 62/589,188, filed on Nov. 21, 2017.

(51) Int. Cl.
*G06F 9/455* (2018.01)
*G06F 17/50* (2006.01)
*G06F 30/392* (2020.01)
*G06F 30/398* (2020.01)

(52) U.S. Cl.
CPC .......... *G06F 30/392* (2020.01); *G06F 30/398* (2020.01)

(58) Field of Classification Search
USPC ........ 716/110, 111, 118, 119, 115, 124, 129, 716/132
See application file for complete search history.

(56) References Cited

U.S. PATENT DOCUMENTS

| | | | |
|---|---|---|---|
| 6,507,941 B1 * | 1/2003 | Leung | G06F 17/5077 716/129 |
| 2002/0029371 A1 * | 3/2002 | Hwang | G06F 17/5068 716/115 |
| 2008/0216026 A1 * | 9/2008 | Gotou | G06F 17/5068 716/132 |
| 2012/0168958 A1 * | 7/2012 | Zhang | H01L 21/3212 257/774 |
| 2016/0154920 A1 * | 6/2016 | Harada | G06F 17/5072 716/124 |
| 2019/0004703 A1 * | 1/2019 | Johri | G06F 12/023 |

* cited by examiner

*Primary Examiner* — Brian Ngo
(74) *Attorney, Agent, or Firm* — WPAT, P.C., Intellectual Property Attorneys; Anthony King

(57) ABSTRACT

A method includes accessing a design data of an integrated circuit (IC), the design data including a plurality of layers. For each of the layers, the method performs: assigning a bin size of the respective layer based on a layout property of the respective layer; and performing a bin-based feature allocation according to the assigned bin size. The method also includes updating the design data according to the bin-based feature allocation. At least one of the accessing, assigning, performing and updating steps is conducted by at least one processor.

20 Claims, 6 Drawing Sheets

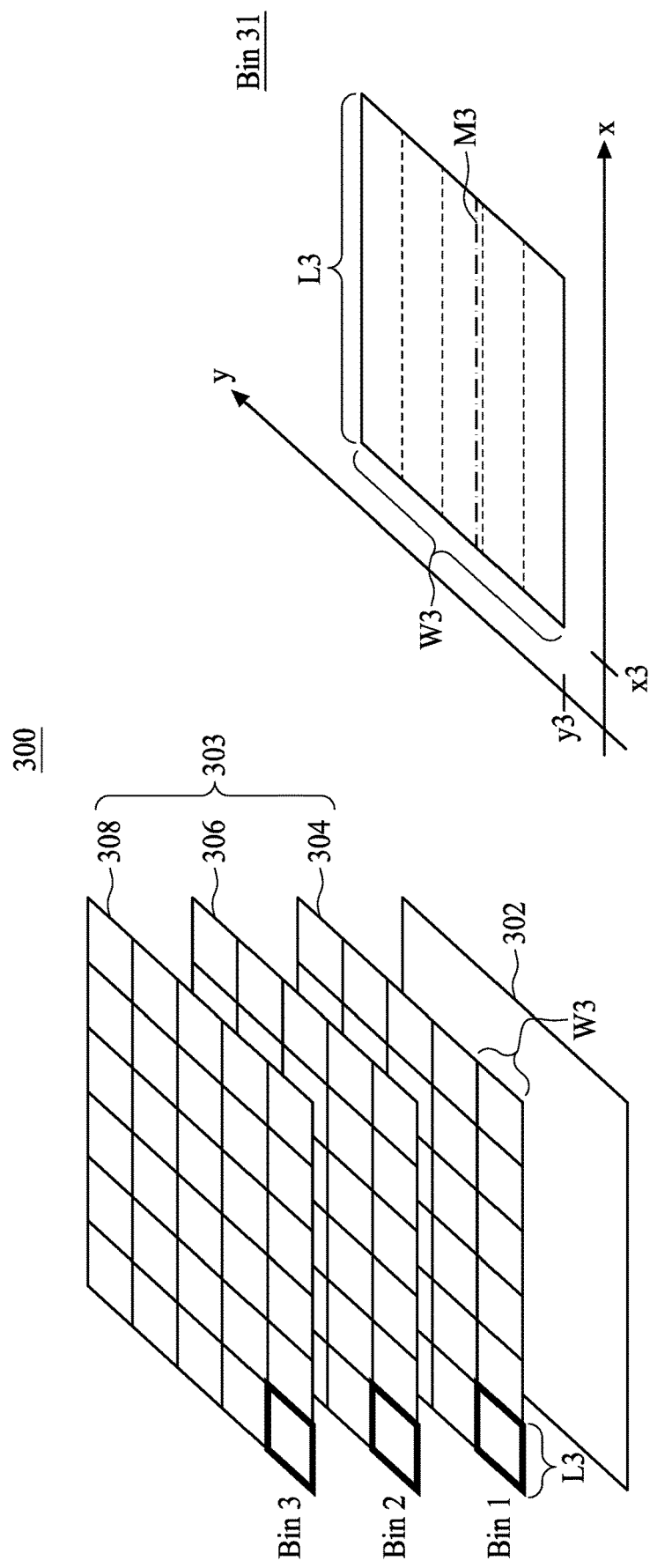

METHOD, SYSTEM, AND STORAGE MEDIUM OF RESOURCE PLANNING FOR DESIGNING SEMICONDUCTOR DEVICE

PRIORITY CLAIM AND CROSS-REFERENCE

This application claims priority to U.S. patent application Ser. No. 62/589,188 filed Nov. 21, 2017, the disclosure of which is hereby incorporated by reference in its entirety.

BACKGROUND

In advanced semiconductor technologies, the continuing reduction in device size and increasingly complicated circuit arrangements have made the designing and fabrication of integrated circuits (ICs) more challenging and costly. Before the circuit design for the ICs is delivered for mass production, the design must be confirmed to meet the design specification and manufacturing criteria. In order to detect design errors or defects as early as possible, computer-aided circuit design tools, which assist circuit designers in identifying potential circuit errors, have become widely accepted in the semiconductor industry. However, as circuit complexity and device density continue to increase quickly, the software procedures that conduct circuit design and verification now consume a great deal of time and resources, and have difficulties in meeting the demands for circuit design. Therefore, it is necessary to improve the design flow for reducing the design cycle time while maintaining the design quality.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A to 3D are schematic diagrams of a layout for a resource planning operation in accordance with some embodiments.

DETAILED DESCRIPTION

Figure 1:
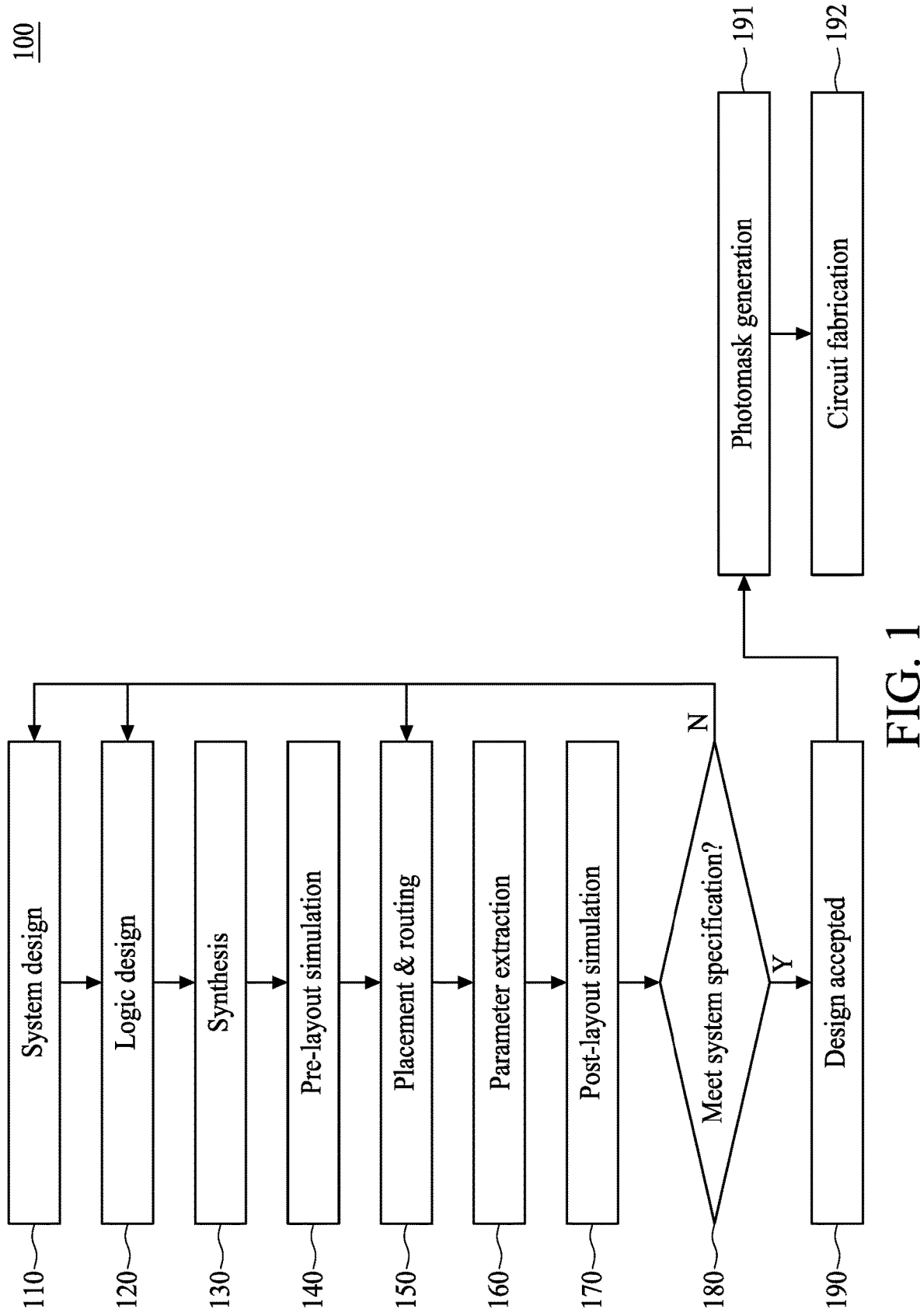
FIG. 1 is a schematic diagram illustrating a design flow of an integrated circuit (IC), in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "resource" used throughout the present disclosure refers to one or more spaces in a layout that are required for disposing the components of an integrated circuit (IC) or chip. The resources or spaces may be described in terms of relative units or measurement values. In some examples, a portion of a resource may be specified by its size, dimension or area. The resources that are consumed during the design stage of the IC may significantly affect the footprint or the number of layers in the finished product of the IC.

The term "resource planning" used throughout the present disclosure refers to spatial management of the IC components during a circuit design stage. Because resources are limited, and more importantly, in order to develop an advanced IC that provides greater functionality with a smaller footprint, the disposition of each component and the relationships between the components should be considered as a whole during the resource planning phase. The tasks of resource planning for a specific component may involve determination of the dimension, area, location, orientation, shape, and other factors. The tasks of resource planning for a component or a module (block) composed of more components may involve its functionality, power, delay, thermal performance, material, and other factors. Resource planning is necessary to comply with a predetermined design rule in order to optimize the manufacture of the IC. In addition, different components may compete for a resource, and thus the design rule may be used prioritize one component or block over another. Due to the very large number of components that must be simultaneously considered during the design of an IC (for example, millions of transistor gates), much of the work of resource planning requires the use of modern computer-aided automation tools. In addition, a layout is usually partitioned into smaller units, which are referred to as bins, and the resource planning is conducted on a bin-by-bin basis. The automation tools are configured to formulate an optimization problem for each bin in which the problem space (or the problem complexity) is determined by the combinations of the allocated resources within each bin. A manual inspection or modification procedure may still be necessary to correct potential design errors or defects left by the computer-executed resource planning.

The present disclosure discusses a resource planning methodology used in the design stage of the manufacture of semiconductor ICs. As the gate count and circuit complexity continue to increase, the resource-planning process comprises an increased percentage of the computational resource, power and time consumed by the hardware and software. The computational burden may be lessened, but the effective modeling precision of the final design will be correspondingly reduced. The situation may become worse when the modeling parameters are equally provided for all layers of the IC in a generic framework, as semiconductor device designs trend toward increased inter-layer circuit differences. For example, for an interconnect structure with a stack of metal layers, a resource planning operation may be performed by partitioning each of the metal layers into an array of bins, and executing resource planning of metal features (e.g., metal lines) on a bin-by-bin basis. However, if the lower and upper metal layers are assigned equal bin sizes for resource planning, but in fact have disparate metal distributions and layout properties, then the modeling accuracy will be compromised. Simulation results show that efficiency and accuracy deteriorate as the disparity between layers increases.

In the present disclosure, an improved bin-based resource planning methodology is provided to provide a more accurate modeling result without greatly increasing computational effort. For a design data (e.g., a netlist) including a stack of metal layers, it is proposed to assign different bin sizes for individual metal layers. The bin size can be optimized for each metal layer based on its layout properties or circuit geometry. The modeling accuracy may be improved and the computational time may be reduced. In addition, the resource planning result provided through the proposed scheme may better reflect the final layout of the metal layers, and thus the design efforts for recursive or manual fixing can be reduced.

FIG. 1 is a schematic diagram illustrating a design flow 100 of a semiconductor integrated circuit (IC), in accordance with some embodiments. The design flow 100, employed for designing semiconductor ICs or chips, utilizes one or more electronic design automation (EDA) tools to perform operations therein. A workstation or personal computer is typically used in executing the tools to accomplish the design flow 100. The design flow 100 comprises a system design stage 110, a logic design stage 120, a synthesis stage 130, a pre-layout simulation stage 140, a placement and routing development stage 150, a parameter extraction stage 160 and a post-layout simulation stage 170.

Initially, at the system design stage 110, a systematic architecture for the chip of interest is provided with a high-level description. At stage 110, the chip functions along with performance requirements are determined according to a design specification. The chip functions are usually represented by respective schematic functional modules or blocks. In addition, an optimization or performance trade-off may be sought to achieve the design specification at acceptable levels of cost and power.

At the logic design stage 120, the functional modules or blocks are described in a register transfer level (RTL) using a hardware description language. Commercially available language tools are generally used, such as Verilog or VHDL. In an embodiment, a preliminary functionality check is performed at stage 120 to verify if the implemented functions conform to the specification set forth in stage 110.

Subsequently, at the synthesis stage 130, the modules in the RTL descriptions are converted into a netlist data where the circuit structure, e.g., logic gates and registers, of each function module are established. In some embodiments, technology mapping of logic gates and registers to available cells in the standard cell libraries are conducted. Further, the netlist data is offered to describe the functional relationship of the chip at a gate level. In an embodiment, the netlist data is transformed from the gate-level view to a transistor-level view.

Subsequently, the gate-level netlist data is verified at the pre-layout simulation stage 140. During the verification process of stage 140, if some of the functions fail the verification in the simulation, the design flow 100 may be paused temporarily or may go back to stage 110 or 120 for further modification. After the pre-layout simulation stage 140, the chip design has passed a preliminary verification and the front-end design process is completed. Next, a back-end physical design process follows.

At the placement and routing stage 150, a physical architecture representing the chip determined during the front-end process is implemented. The layout development involves a placement operation and a routing operation in sequence. Detailed structure and associated geometry for the components of the chip are determined in the placement operation. Interconnects among different components are routed subsequent to the placement operation. Both placement and routing operations are performed to meet a design rule check (DRC) deck so that the manufacturing requirements of the chip are fulfilled. In an embodiment, a clock tree synthesis operation is performed at the placement and routing stage for a digital circuit in which clock generators and circuits are incorporated into the design. In an embodiment, a post-routing operation is performed subsequent to the preliminary routing operation in order to fix timing issues with the preliminary routing operation. Once the stage 150 is completed, a placed-and-routed layout is created and a netlist along with data on placement and routing is generated accordingly.

At the parameter extraction stage 160, a layout parameter extraction (LPE) operation is conducted to derive layout-dependent parameters, such as parasitic resistance and capacitance, resulting from the layout developed in stage 150. Subsequently, a post-layout netlist data, which includes the layout-dependent parameters, is generated.

At the post-layout simulation stage 170, a physical verification is performed taking into consideration the parameters acquired in previous stages. A simulation of transistor-level behavior is conducted to examine whether the chip performance meets the required system specifications. In some embodiments, the post-layout simulation is performed to minimize possibilities of electrical issues or layout difficulties during the chip manufacturing process.

Next, in stage 180 it is determined whether the post-layout netlist meets the design specifications. If affirmative, the circuit design is accepted at stage 190 and then signed off accordingly. The chip is manufactured according to the accepted post-layout netlist. However, if the result of the post-layout simulation is unfavorable, the design flow 100 loops back to previous stages for tuning functionalities or structures. For example, the design flow 100 may loop back to stage 150 where the layout is re-developed to fix issues from a physical perspective. Alternatively, the design flow 100 may retreat to an earlier stage 110 or 120 to recast the chip design from a functional level in case the problems cannot be resolved within the back-end process.

At stage 191, at least one photomask is generated based on the verified post-layout netlist in the stage 190. A photomask is a patterned mask used to allow a portion of light to pass through while blocking other portions of the light in order to form a pattern of features on a light-sensitive layer, for example, a photoresist layer on a wafer. In some embodiments, a multi-layer layout netlist may require multiple photomasks in which the feature pattern in each layer is established in the corresponding photomask. As a result, the geometries of the layout features on the photomasks are transferred to the light-sensitive layer through an exposure operation.

At stage 192, the circuit is fabricated on the wafer using the photomasks generated in stage 191. The fabrication may involve known semiconductor manufacturing operations, such as lithography, etching, deposition, and thermal operations. In some embodiments, a testing operation may be utilized in an intermediate or final phase of stage 192 to ensure physical and functional integrity of the fabricated circuit. In some embodiments, a singulation operation may be used to separate the circuit wafer into individual circuit dies. The fabrication of the circuit is thus completed.

The design flow 100 illustrated in FIG. 1 is exemplary. Modifications to the above-mentioned stages, such as change of order for the stages, partition of the stages, and deletion or addition of stages, are within the contemplated scope of the present disclosure.

Figure 2:
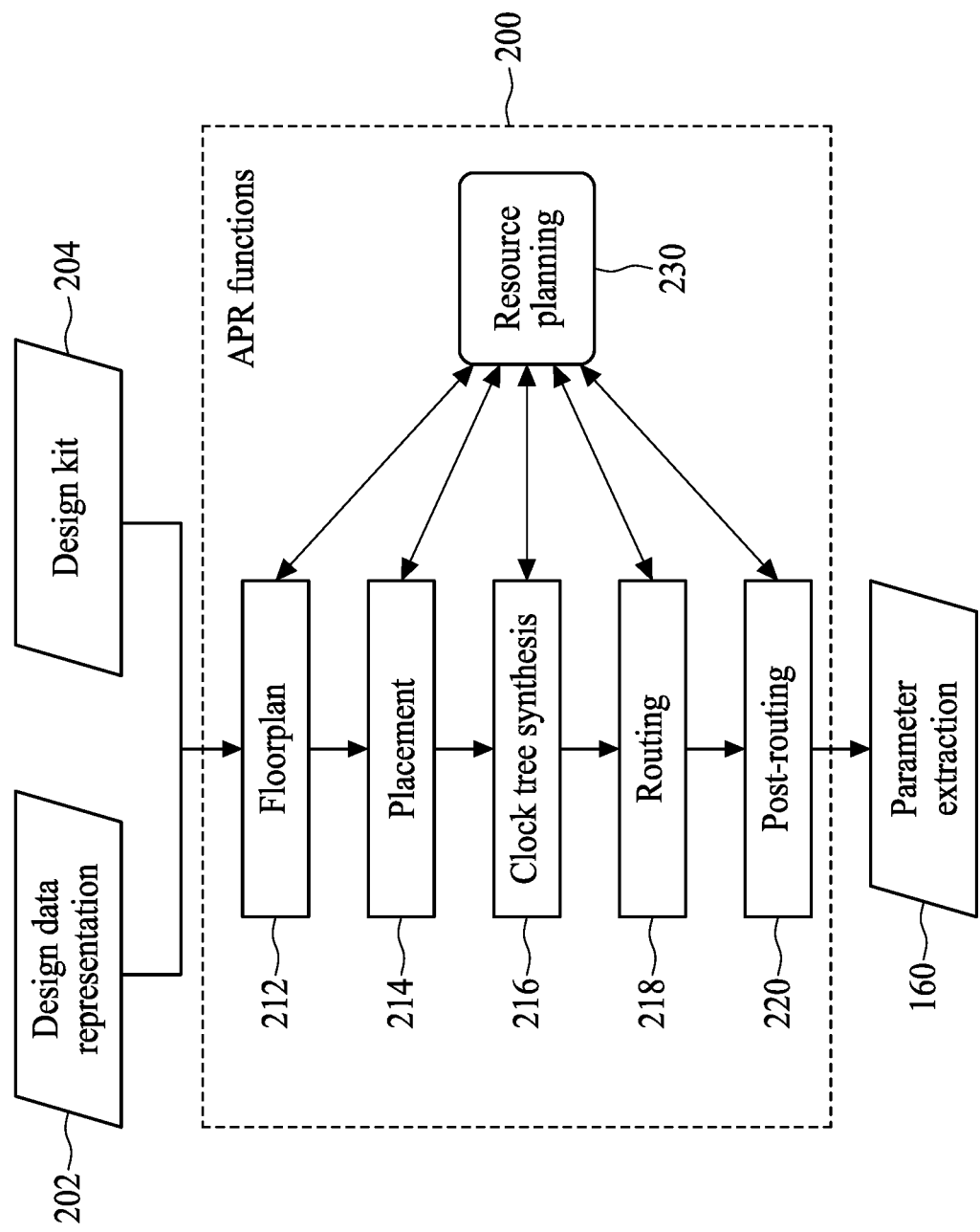
FIG. 2 is a schematic diagram of an automatic placement and routing function in accordance with some embodiments.

FIG. 2 is a schematic diagram of an automatic placement and routing (APR) function 200 in accordance with some embodiments. The APR function 200 may correspond to the placement and routing operation of stage 150 in FIG. 1. Initially, a representation of design data 202 and a design kit 204 are received or provided for the APR function 200. The design data 202 may include a form of netlist or other exchangeable data format that schematically describes electrical properties of and connections between the components of the chip. In an embodiment, the design kit 204 contains process-related descriptions of the components of the chip. The design kit 204 may be created by an IC manufacturing company defining technology details or variations based on its proprietary manufacturing processes. The IC designers may leverage the design kit 204 to facilitate the modeling and simulation of the chip before delivering the completed design data to the manufacturing company to produce the IC.

The APR function 200 may include at least one of a floorplan operation 212, a placement operation 214, a clock tree synthesis operation 216, a routing operation 218 and a post-routing operation 220. The above-mentioned operations of the APR function 200 may be performed successively as illustrated in FIG. 2. Alternatively, the above-mentioned operations may be iterated in case an error is detected or an inline design rule checking routine finds a design issue. In some embodiments, at least one operation may be omitted from the processing flow in the APR function 200. In addition, the APR function 200 includes a resource planning operation 230. As illustrated in FIG. 2, the resource planning operation 230 may interact with any one of the operations in the APR function 200. The interaction details are elaborated in the following paragraphs.

FIG. 3A is a schematic diagram of a layout 300 for a resource planning operation 230 of FIG. 2 in accordance with some embodiments. The layout 300 includes a transistor layer 302 and an interconnect structure 303 over the transistor layer 302. The transistor layer 302 includes several components, such as transistors and metal lines (not separately shown). The transistors and metal lines may be constructed by a circuit counterpart (i.e., library cells) selected from a proven circuit library. The interconnect structure 303 is configured to electrically couple the components in the transistor layer 302 through the metal layers thereof, and is sometimes referred to as a redistribution layer. As an example, the interconnect structure 303 is constructed with a stack of metal layers, such as a first metal layer 304, a second metal layer 306 and a third metal layer 308. Generally, the resource planning operation 230 determines the disposition of both cells in the transistor layer 302 and metal lines in the interconnect structure 303. Moreover, the resource planning for the interconnect structure 303 may require adaptation to align with that for the transistor layer 302. In some regards, the operations 212, 214, 216, 218 and 220, which are referred to as basic operations of the APR function 200 herein, are more related to the transistor layer 302 than to the interconnect structure 303. Throughout the present disclosure, the resource planning operation 230 covers the transistor layer 302 and the interconnect structure 303, but may be more focused on the interconnect structure 303. When each of the basic operations is performed for the transistor layer 302, a resource planning operation 230 may be automatically triggered for modifying the interconnect structure 303. In the following description, the first operation, i.e., the floorplan operation 212, is described as a first example to explain the interaction between the basic operations and the resource planning operation 230.

Referring to FIG. 2 and FIG. 3A, during the floorplan operation 212, an initial plane of the transistor layer 302 in FIG. 3A is provided. The floorplan operation 212 may group the components of the design data into several functional blocks or modules based on their functionalities. Further, the floorplan operation 212 allocates the blocks in suitable locations of the transistor layer 302. The floorplan operation 212 may also provide block coordinates, although they may be approximate values. The block coordinates may be represented in terms of a pair of reference coordinates of the layout 300.

When the functional blocks are allocated to their positions in transistor layer 302 during the floorplan operation 212, a resource planning for the interconnect structure 303 is activated by the resource planning operation 230. Each of the first metal layer 304, the second metal layer 306 and the third metal layer 308 is partitioned into an array of bins, i.e., bin 1, bin 2 and bin 3, respectively. The bins may be of a rectangular shape and the bin size may be characterized by length L3 and width W3. Each of the metal layers 304, 306 and 308 may be assigned individual bin sizes. In the depicted example of FIG. 3A, the bin length L3 and the bin width W3 are same for bin 1, bin 2 and bin 3 of all the metal layers. In alternative embodiments, the bin sizes are assigned differently for different metal layers. After the bin size for the respective metal layer is assigned, a bin-based feature allocation is performed for each metal layer.

FIG. 3B is a schematic diagram of a layout of the third metal layer 308, in accordance with some embodiments. Assume the resource planning operation 230 proceeds with a first bin of the third metal layer 308, for example, bin 31. Initially it is determined how many metal lines can be accommodated in a single bin. The determination factors include the line density of the metal layers and the bin size. In some embodiments, the determination factors involve a representative line width or line spacing value of the metal lines, where the representative value may be obtained by computing an average value. In some embodiments, the determination factors involve a resistance-capacitance (RC) value of the metal lines, in which the RC value accounts for a delay of the metal line. In the depicted example, four dashed lines in the bin 31 represent that the metal line capacity of the bin 31 is four. Next, an exemplary metal line M3, represented by a solid line, is allocated to bin 31. The metal line M3 is arranged along the x-axis. A reference location of the horizontal metal line M3 is provided based on the coordinates of the bin 31. For example, a lower-left vertex of the bin 31 with coordinates (x3, y3) is provided as an approximate location of the metal line M3. Alternatively, centroid coordinates (not shown) or other representative coordinates of the bin 31 may also be used as a reference location of the metal line M3. In an embodiment, the index of the bin 31 is used as the reference location of the metal line M3. In that situation, a transformation between the bin index and the actual bin location may be required. The illustration of the metal line M3 coincident with a dashed line in the bin 31 does not mean that the resource planning operation 230 has currently determined an accurate location of the metal line M3 in the bin 31. In fact, the location of the metal line M3 can be defined within the third metal layer 308 only at the granularity (or resolution) of the size of the bin 31. A more accurate positioning of the metal line M3 in the third metal layer 308 should be achieved through another iteration of the resource planning operation 230 with a smaller bin size associated with a subsequent basic operation of the APR function 200. Other bins in the third metal layer 308 are subsequently processed in a manner similar to that of the bin 31 until all metal lines to be allocated in the third metal layer 308 have been processed.

Figure 3D:
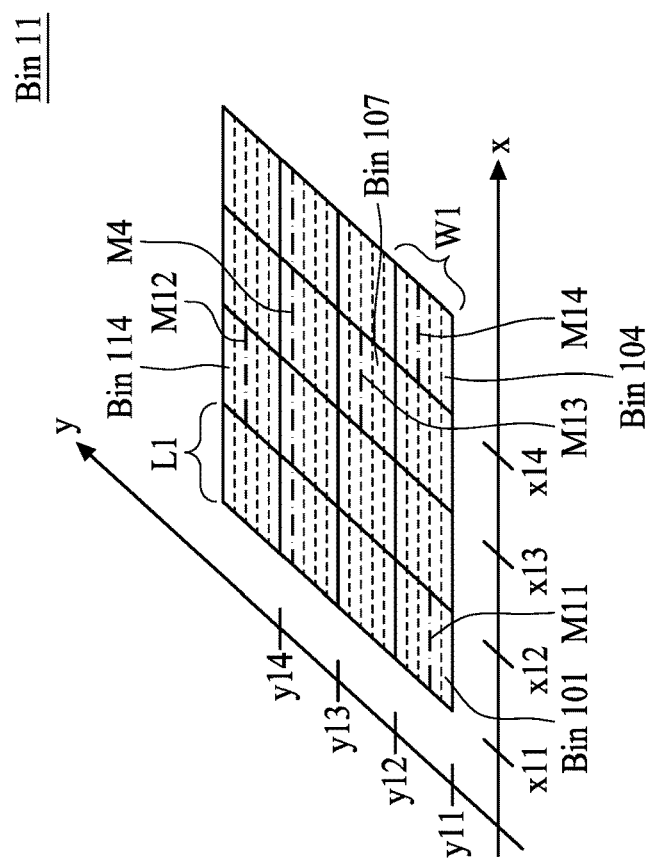
Figure 3C:
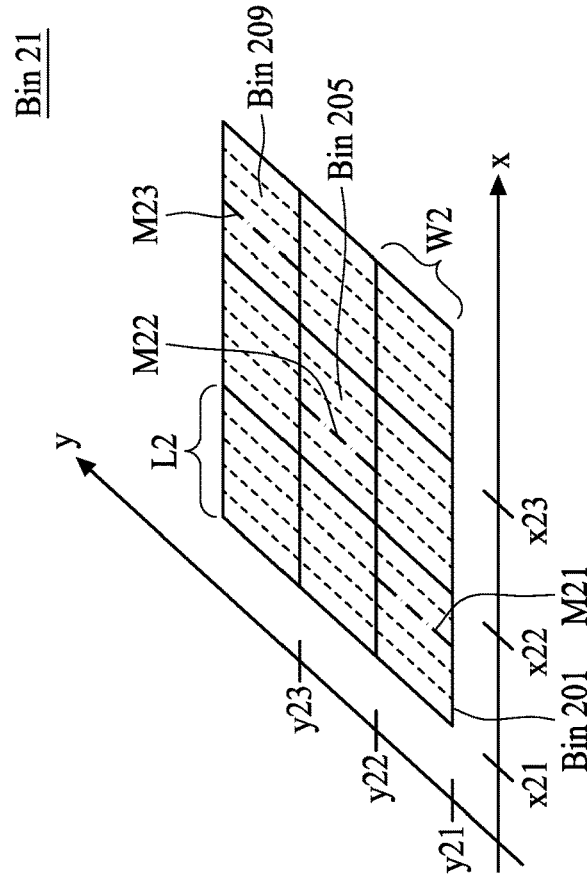

FIG. 3C is a schematic diagram of a layout of the second metal layer 306, in accordance with some embodiments. The resource planning operation 230 proceeds with a first bin of the second metal layer 306, for example bin 21. Initially it is determined how many metal lines can be accommodated in a single bin 21. The determination factors are similar to those used for the second metal layer 306. In some embodiments, the line width or line spacing of the metal layers in the interconnect structure 303 is increased from a bottom layer (e.g., first metal layer 304) to a top layer (e.g., third metal layer 308). In the depicted example, twelve dashed lines in the bin 21 indicate that the capacity of bin 21 for metal lines is twelve, which is three times that of the bin 31 in the third metal layer 308, due to differences in line width or line spacing. It is thus determined to further divide the bin 21 into nine smaller bins, e.g., bin 201 through bin 209. Bins 201 through 209 can be regarded as sub-bins of the parent bin 21, wherein each bin has a bin length L2 and a bin width W2. The bin size of the bin 21 may be a multiple of the bin size of each of the bins 201 through 209. In an embodiment, the determination factors for the bin size include the metal line capacity of a bin. By dividing the bin 21 into smaller bins 201 through 209, the metal line capacity per bin is kept at approximately four, which is same as that of bin 31.

Next, an exemplary metal line M2, which is scheduled to span the entire width W3 of the bin 31, is divided into three segments M21, M22 and M23, each with a line length equal to the bin width W2. The metal line segments are represented by solid lines and allocated into a respective sub-bin of bin 21. The metal line segments M21 through M23 in the second metal layer 306 may be electrically connected to the first metal layer 304 or the third metal layer 308 through intervening conductive vias (not shown) to change the orientation and route of the metal line M2. In some embodiments, the metal lines in the adjacent metal layers are arranged in substantially perpendicular directions. For example, the metal line segments M21, M22 and M23 are arranged along the y-axis as compared to the horizontal metal line M3 in the third metal layer 308.

A reference location of the metal line segment M21 is provided based on the coordinates of the bin 201. For example, a lower-left vertex of the bin 201 with coordinates (x21, y21) is provided as an approximate location of the metal line segment M21. Alternatively, centroid coordinates (not shown) or other representative coordinates of the bin 201 may be used as a reference location of the metal line segment M21. The allocation of the metal line segments M22 and M23 into bin 205 and bin 209, respectively, is conducted in an approach to the metal line segment M21. In an embodiment, the indices of the bins 201, 205 and 209 are used as the reference locations of the metal line segments M21, M22 and M23, respectively. In that situation, a transformation between the bin index and the actual bin location may be required. However, the illustration of the metal line segments M21 through M23 coincident with corresponding dashed lines in the respective bins does not mean that the resource planning operation 230 has determined accurate coordinates of the metal line segments M21, M22 and M23 in bins 201, 205 and 209, respectively. In fact, positions of the metal line segments can be identified within the second metal layer 306 only at the granularity (or resolution) of the sub-bins of the bin 21, e.g., bin 201. More accurate positioning of the metal line segments M21 through M23 in the second metal layer 306 can be achieved through another iteration of the resource planning operation 230 with a smaller bin size associated with a subsequent basic operation of the APR function 200. Bins other than bin 21 in the second metal layer 306 are subsequently processed in a manner similar to that of the bin 21 until all metal lines to be allocated in the second metal layer 306 have been processed.

Existing schemes process the bin 21 by adopting the bin size of bin 31 as a basis for allocating the metal line M2. That is, the bin size of the bin 21 is determined based solely on the bin size of bin 31 used for the third metal layer 308. However, the metal line capacity of bin 21 has been increased three times. Thus, greater metal line capacity of bin 21 results in greater (e.g., triple) allocation uncertainty in the second metal line 306 as compared to that in the third metal line 308. As such, additional iterative resource planning tasks may be necessary in subsequent operations because the resource planning uncertainty resulting from the floorplan operation stage 212 remains relatively high, especially in the second metal layer 306. Furthermore, the software tools may need to deal with a resource planning problem for the bin 21 with triple the space as compared to that of the bin 31. More processing time is required and the optimal solution, if any exists, is more difficult to reach under existing schemes as compared to the method of the present disclosure.

Through the proposed framework, the reference locations of the metal line segments in the second metal layer 306 provide a threefold increase in positioning accuracy from L3 to L2. The metal line uncertainty in bins 201 through 209 is kept comparable to that of bin 31 in the third metal layer 308. In addition, the size of the problem space is reduced, which may aid in reducing the processing time and finding a better solution to feature allocation. Although the total number of bins to be processed is multiplied, the overall processing time may not increase much since the order of the problem space for each bin has been decreased. More importantly, the difference of allocation uncertainty levels for the metal lines in different metal layers is decreased across the entire interconnect structure 303. The circuit design does not include any layer with unduly more routing uncertainty than other layers. A better resource planning output and more predictable routing performance can thus be realized.

Another advantage of the bin splitting for the bin 21 results from the additional routing possibilities of the metal line M2. Generally, a resource planning operation allows a metal line to be allocated in a bin along a consistent direction for simplicity, as can be seen in the illustration of the metal line M3 in the bin 31. The split bins 201 through 209 allow the metal line M2 to include at least two turns between the three metal line segments. As the line density is elevated, a smaller bin size can help the designer or the design tools incorporate more turns to a metal line, as shown in the illustration of the metal line M2. A more compact and accurate routing layout can be accomplished at an early stage of the design process.

FIG. 3D is a schematic diagram of a layout of the first metal layer 304, in accordance with some embodiments. The resource planning operation 230 proceeds with a first bin of the first metal layer 304, for example bin 11. In the depicted example, sixteen dashed lines in bin 11 indicate that the capacity of bin 11 for metal lines is sixteen, which is four times that of bin 31 in the third metal layer 308, due to a smaller line width or tighter line spacing. Thus, bin 11 is divided into sixteen smaller bins, e.g., bin 101 through bin 116. The bins 101 through 116 can be regarded as sub-bins of the parent bin 11, wherein each bin has a bin length L1 and a bin width W1. The bin size of the bin 11 may be a multiple of the bin size of each of the bins 101 through 116. By dividing the bin 11 into smaller bins 101 through 116, the metal line capacity per bin is kept at approximately four, which is same as that of the bin 201 and bin 31. In an embodiment, the bin sizes are made progressively larger from a bottom layer (e.g., the first metal layer 304) to a top layer (e.g., the third metal layer 308). In an embodiment, the maximum bin size (L3, W3) is a multiple of the other smaller bin sizes, such as the bin size (L2, W2) or the bin size (L1, W1).

Next, an exemplary metal line M1 that is scheduled to span the entire width L3 of the bin 31 is divided into four segments M11, M12, M13 and M14, each with a line length equal to the bin length L1. The metal line segments are represented by solid lines and allocated into the individual sub-bins of bin 11. The metal line segments M11 though M14 in the first metal layer 304 may be electrically connected to the second metal layer 306 through intervening conductive vias (not shown) to change the orientation and route of the metal line M1. In some embodiments, the metal line segments M11 through M14 are arranged along the x-axis, in contrast to the vertical metal line segments M21 through M23 in the second metal layer 306.

A reference location of the metal line segment M11 is provided based on the coordinates of the bin 101. For example, a lower-left vertex of the bin 101 with coordinates (x11, y11) is provided as an approximate location of the metal line segment M11. Alternatively, centroid coordinates (not shown) of the bin 101 may also be used as a reference location of the metal line segment M11. The allocation of the line segments M12, M13 and M14 into bins 114, 107 and 104, respectively, is conducted with an approach similar to that of the metal line segment M11. In an embodiment, the indices of the bins 101, 114, 107 and 104 are used as the reference locations of the respectively metal line segments M11, M12, M13 and M14. In that situation, a transformation between the bin index and the actual bin location may be required. As discussed previously, the positions of the metal line segments M11 through M14 can be specified within the first metal layer 304 only at the granularity (or resolution) of the sub-bins of the bin 11, e.g., bin 101. A more accurate positioning of the metal line M1 in the first metal layer 304 can be achieved through another iteration of the resource planning operation 230 with a smaller bin size associated with a subsequent basic operation of the APR function 200. Bins other than bin 11 in the second metal layer 304 are subsequently processed in a manner similar to that of the bin 11 until all metal lines to be allocated in the first metal layer 304 have been processed.

In an embodiment, another metal line M4 is allocated to bin 11. The metal line has a line length 4*L1 and is allocated to the sub-bins 109, 110, 111 and 112. An analysis of metal line congestion can be performed to confirm that the metal lines M1 and M4 can be allocated together within the bin 11 while complying with the design criteria. That is because it is clear that the two different metal lines M1 and M4 are allocated into different sub-bins of bin 11. Such information is buried and is not visible to a designer using the existing scheme adopting a bin size of the parent bin 11. The allocation uncertainty issue can be accordingly solved at an earlier stage of the design process. It may also help prevent unduly optimistic anticipation of subsequent routing performance if the above-mentioned feature allocation into separate sub-bins cannot be achieved with the split bins 201 through 216.

In an embodiment, a design rule check is performed subsequent to the resource planning operation 230 to determine if the feature allocation of the metal lines in the metal layers 304, 306 and 308 meets the manufacturing criteria and design specification. The design rules may include a minimum line spacing, a maximum line width, and the like.

Referring back to FIG. 2, when the resource planning for all of the metal layers in the interconnect structure 303 associated with the floorplan operation 212 is completed, the layout data for the interconnect structure 303 is updated. The updated layout data may include the coordinates of the metal lines in each of the metal layers. In an embodiment, the result of the resource planning operation 230, e.g., the updated coordinates of the metal lines based on different bin sizes, may be stored in a database of the software tools and made accessible to other operations of the APR function 200. Next, the APR function 200 may proceed with subsequent operations, such as the placement operation 214. Cells for the components in the transistor layer 302 are allocated in their suitable places through the placement routines. Subsequently, a resource planning operation associated with the placement operation 214 is activated. The bin size for resource planning of the metal layer 304, 306 or 308 associated with the placement operation 214 may be smaller than that associated with the floorplan operation 212 for obtaining greater metal line position accuracy.

The above procedures may be applied to the remaining operations of the APR function 200. During the clock tree synthesis operation 216, clock signal generators are placed in the transistor layer 303 and a timing analysis is performed on the nodes across the layout 300 to ensure the timing distribution meets the specification requirement. During the routing operation 218, wiring connections are incorporated to connect the cells in the transistor layer 303 of the layout 300. In an embodiment, design rule checking is performed to determine if the wiring configurations (e.g., wire spacing) meet the manufacturing criteria and design specification. In an embodiment, the layout 300 may need further refinement to fix the power or timing issues. As a result, the post-routing operation 220 may be introduced to modify the previous routing configuration taking into account the layout refinement. All of the basic operations are performed followed by an associated resource planning operation 230 that modifies the metal line configurations in the interconnect structure 303. Moreover, the bin sizes for each metal layer in the interconnect structure 303 may be progressively smaller as the APR function proceeds with more basic operations.

Figure 4:
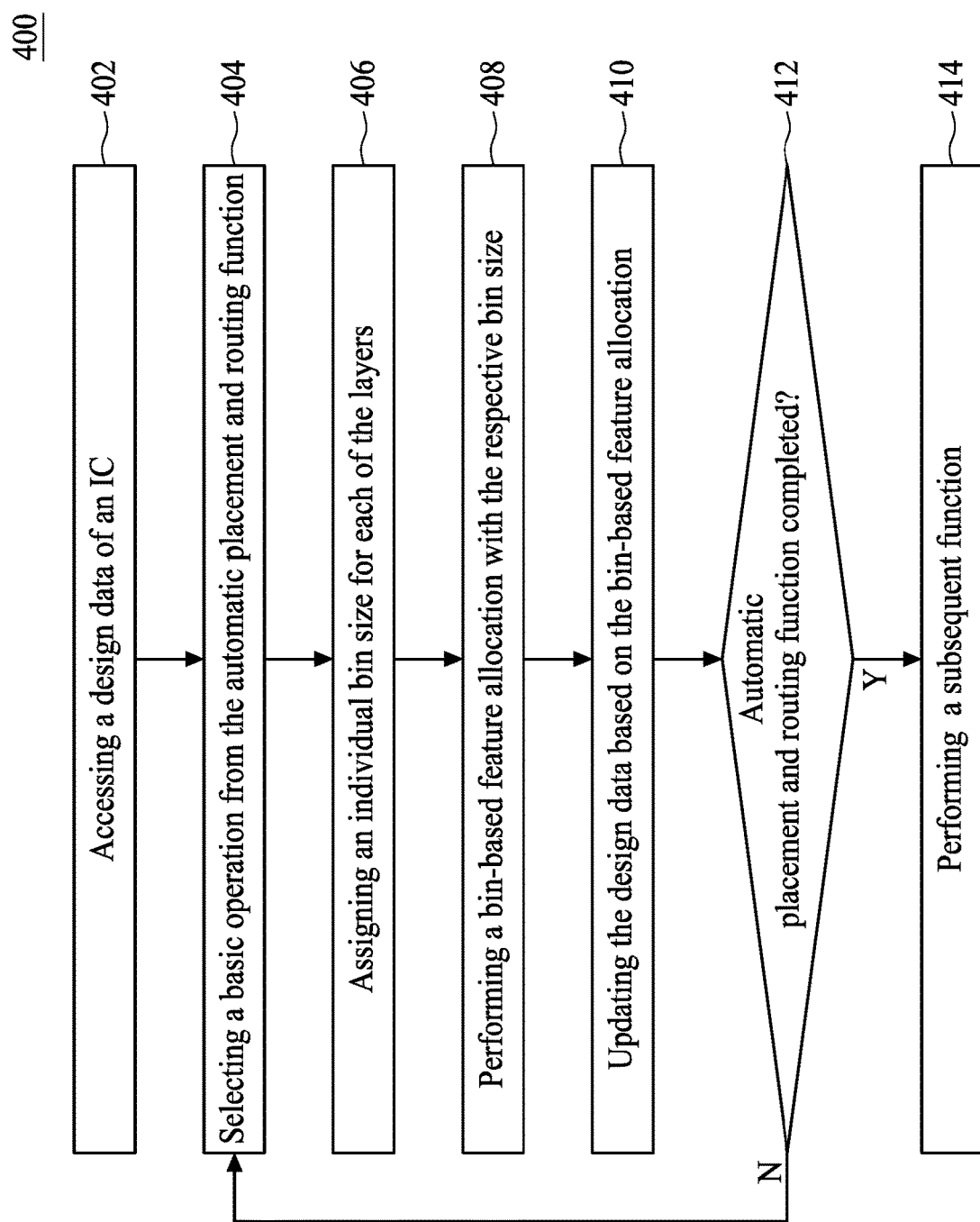
FIG. 4 is a schematic diagram illustrating a design flow of an IC, in accordance with some embodiments.

FIG. 4 is a schematic diagram illustrating a design flow 400 of an IC, in accordance with some embodiments. In operation 402, a design data of the IC is accessed or received. The design data includes an interconnect structure composed of a stack of layers, wherein each layer contains several features, such as metal lines. In operation 404, a basic operation of the APR function is selected. The basic operation may include at least one of a floorplan operation, a placement operation, a clock tree synthesis operation, a routing operation and a post-routing operation. Subsequently, a resource planning operation is performed. In operation 406, a bin size for each of the layers is assigned individually. In operation 408, a bin-based feature allocation for each layer is performed based on the respective bin size. In operation 410, the design data is updated based on the bin-based feature allocation.

In operation 412, it is determined whether the APR function is completed. If affirmative, the design flow 400 proceeds with subsequent functions, such as the stage 160 or 170 of the design flow 100 described and illustrated with reference to FIG. 1. If it is determined that not all necessary basic operations of the APR function are performed, the flow returns to the operation 404 and selects another operation of the APR function.

Figure 5:
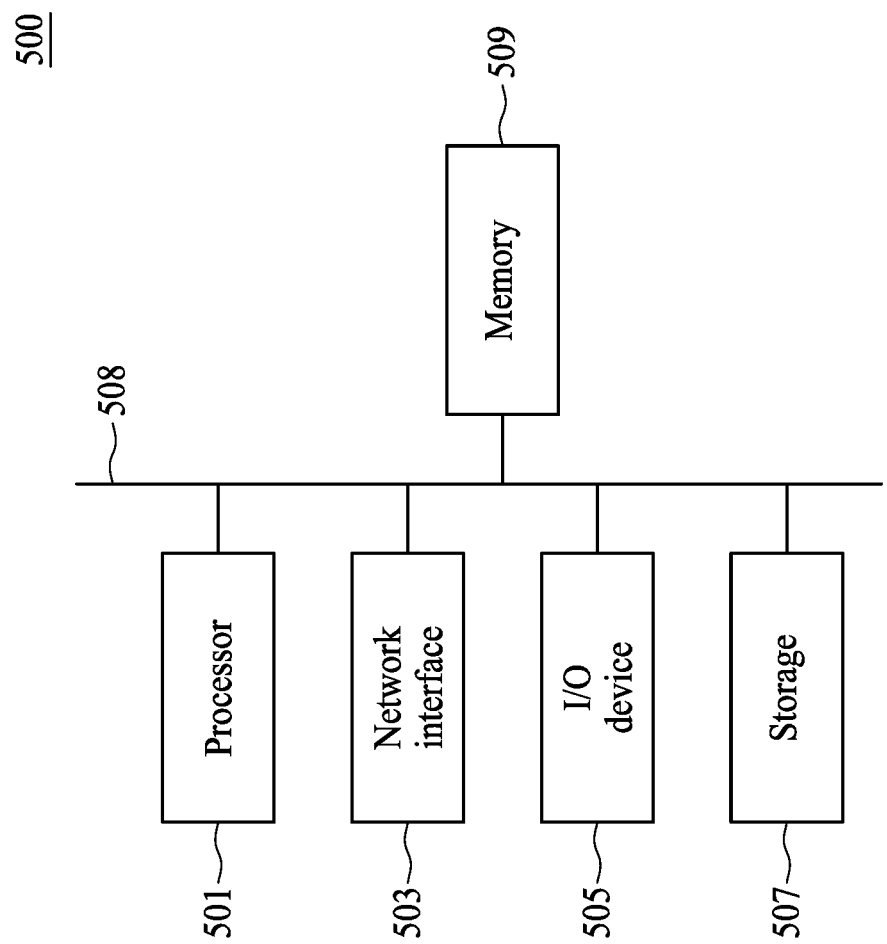
FIG. 5 is a schematic diagram of a system implementing layout designs, in accordance with some embodiments.

FIG. 5 is a schematic diagram of a system 500 implementing layout designs, in accordance with some embodiments. The system 500 includes a processor 501, a network interface 503, an input/output (I/O) device 505, a storage 507, a bus 508 and a memory 509. The bus 508 couples the network interface 503, the I/O device 505, the storage 507, the memory 509 and the processor 501 to each other.

The processor 501 is configured to execute program instructions that include a tool configured to perform the method as described and illustrated with reference to figures of the present disclosure. Accordingly, the tool is configured to execute the steps such as: provide design specifications, generate a netlist of a circuit, perform pre-layout simulation, generate a design data for a layout, perform resource planning, perform operations of placement and routing, perform LVS, generate a consolidated netlist by incorporating the parameters, perform post-layout simulation and verify the post-layout simulation result.

The network interface 503 is configured to access program instructions and data accessed by the program instructions stored remotely through a network (not shown).

The I/O device 505 includes an input device and an output device configured for enabling user interaction with the system 500. In some embodiments, the input device comprises, for example, a keyboard, a mouse, and other devices. The output device comprises, for example, a display, a printer, and other devices.

The storage device 507 is configured for storing program instructions and data accessed by the program instructions. In some embodiments, the storage device 507 comprises a non-transitory computer readable storage medium, for example, a flash memory, a magnetic disk, an optical disk or the like.

The memory 509 is configured to store program instructions to be executed by the processor 501 and data accessed by the program instructions. In some embodiments, the memory 509 comprises any combination of a random access memory (RAM), some other volatile storage device, a read only memory (ROM), and some other non-volatile storage device.

According to an embodiment, a method includes accessing a design data of an integrated circuit (IC), the design data comprising a plurality of layers. For each of the layers, the method includes: assigning a bin size of the respective layer based on a layout property of the respective layer; and performing a bin-based feature allocation according to the assigned bin size. The method also includes updating the design data according to the bin-based feature allocation. At least one of the accessing, assigning, performing and updating steps is conducted by at least one processor.

According to an embodiment, a system includes one or more processors and one or more programs including instructions which, when executed by the one or more processors, cause the system to perform the steps of: accessing a design data of an integrated circuit (IC), the design data comprising a plurality of layers; for each of the layers, performing: assigning a bin size of the respective layer based on a layout property of the respective layer; and performing a bin-based feature allocation according to the assigned bin size. The steps also include updating the design data according to the bin-based feature allocation.

According to an embodiment, a non-transitory computer readable storage medium comprises instructions which, when executed by a processor, performs the steps of: accessing a design data of an integrated circuit (IC), the design data comprising a plurality of layers; for each of the layers, performing: assigning a bin size of the respective layer based on a layout property of the respective layer; and performing a bin-based feature allocation according to the assigned bin size. The steps also include updating the design data according to the bin-based feature allocation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    accessing a design data of an integrated circuit (IC), the design data comprising a plurality of layers;
    for each of the layers:
        assigning a bin size of the respective layer based on a layout property of the respective layer; and
        performing a bin-based feature allocation according to the assigned bin size; and
    updating the design data according to the bin-based feature allocation,
    wherein at least one of the accessing, assigning, performing and updating steps is conducted by at least one processor,
    wherein the bin sizes are progressively larger from a bottom layer to a top layer among the plurality of layers.

2. The method according to claim 1, further comprising manufacturing the IC based on the updated design data.

3. The method according to claim 1, further comprising performing a design rule check for each of the layers to determine if the bin-based feature allocation meets a specification.

4. The method according to claim 1, wherein the layout property of the respective layer comprises a density of metal lines in the respective layer.

5. The method according to claim 1, wherein the layout property of the respective layer comprises a representative resistance-capacitance (RC) value of metal lines in the respective layer.

6. The method according to claim 1, wherein a maximum bin size among all of the bin sizes is a multiple of each of the other bin sizes.

7. The method according to claim 1, wherein performing a bin-based feature allocation comprises selecting a target bin in the respective layer and allocating a metal line to the target bin.

8. The method according to claim 7, wherein updating the design data according to the bin-based feature allocation comprises providing representative coordinates of the target bin to indicate a location of the metal line allocated to the target bin.

9. The method according to claim 1, wherein the bin-based feature allocation is performed subsequent to an operation of a placement and routing (PAR) function, selected from the group consisted of a floorplan operation, a cell placement operation, a clock tree synthesis operation and a routing operation.

10. The method according to claim 9, wherein the PAR functions comprise a first operation and a second operation in order, and a first bin size assigned to a first layer associated with the first operation is greater than a second bin size assigned to the first layer associated with the second operation.

11. A system, comprising one or more processors and one or more programs including instructions which, when executed by the one or more processors, cause the system to perform the steps of:
   accessing a design data of an integrated circuit (IC), the design data comprising a plurality of layers;
   for each of the layers:
      assigning a bin size of the respective layer based on a layout property of the respective layer; and
      performing a bin-based feature allocation by selecting a target bin in the respective layer according to the assigned bin size and allocating a metal line to the target bin; and
   updating the design data according to the bin-based feature allocation.

12. The system according to claim 11, wherein the layout property of the respective layer comprises a spacing of metal lines in the respective layer.

13. The system according to claim 11, wherein the layout property of the respective layer comprises a representative resistance-capacitance (RC) value of metal lines in the respective layer.

14. The system according to claim 11, wherein the bin sizes are progressively larger from a bottom layer to a top layer among the plurality of layers.

15. The system according to claim 11, wherein updating the design data according to the bin-based feature allocation comprises providing representative coordinates of the target bin as a location of the metal line allocated to the target bin.

16. A non-transitory computer readable storage medium, comprising instructions which, when executed by a processor, performs the steps of:
   accessing a design data of an integrated circuit (IC), the design data comprising a plurality of layers;
   for each of the layers:
      assigning a bin size of the respective layer based on a layout property of the respective layer; and
      performing a bin-based feature allocation according to the assigned bin size; and
   updating the design data according to the bin-based feature allocation,
   wherein the bin sizes are progressively larger from a bottom layer to a top layer among the plurality of layers.

17. The non-transitory computer readable storage medium according to claim 16, further comprising manufacturing the IC based on the updated design data.

18. The non-transitory computer readable storage medium according to claim 16, further comprising performing a design rule check for each of the layers to determine if the bin-based feature allocation meets a specification.

19. The non-transitory computer readable storage medium according to claim 16, wherein the layout property of the respective layer comprises a density of metal lines in the respective layer.

20. The non-transitory computer readable storage medium according to claim 16, wherein the layout property of the respective layer comprises a representative resistance-capacitance (RC) value of metal lines in the respective layer.

* * * * *